United States Patent
Shih et al.

(10) Patent No.: US 6,329,722 B1
(45) Date of Patent: Dec. 11, 2001

(54) BONDING PADS FOR INTEGRATED CIRCUITS HAVING COPPER INTERCONNECT METALLIZATION

(75) Inventors: Wei-Yan Shih, Plano; Arthur Wilson, Richardson; Willmar Subido, Garland, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/346,636

(22) Filed: Jul. 1, 1999

(51) Int. Cl.⁷ .............................. H05K 3/32; H05K 3/34; H01L 23/48; H01L 29/44
(52) U.S. Cl. .................. 257/786; 257/784; 257/762; 257/690; 257/778; 257/783; 257/737
(58) Field of Search .................... 257/666, 784, 257/690, 772, 779, 783, 778, 737, 738, 762, 786

(56) References Cited

U.S. PATENT DOCUMENTS

| | | | |
|---|---|---|---|
| 4,017,886 | * | 4/1977 | Tomono et al. ................ 257/643 |
| 4,151,545 | * | 4/1979 | Schnepf et al. ................ 257/765 |
| 4,628,150 | * | 12/1986 | Luc ................................... 29/828 |
| 4,806,200 | * | 2/1989 | Larson et al. .................... 29/852 |
| 4,995,551 | * | 2/1991 | MacKay .......................... 228/177 |
| 5,047,834 | * | 9/1991 | Kovac et al. . |
| 5,186,383 | * | 2/1993 | Melton et al. ................ 228/180.22 |
| 5,358,622 | * | 10/1994 | Kursten ........................... 205/125 |
| 5,420,073 | * | 5/1995 | DiGiacomo et al. ............. 427/96 |
| 5,455,461 | * | 10/1995 | Koide et al. .................... 257/746 |
| 5,480,835 | * | 1/1996 | Curney et al. ................... 438/614 |
| 5,663,529 | * | 9/1997 | McMillan, II et al. .......... 174/252 |
| 5,677,203 | * | 10/1997 | Rates . |
| 5,734,200 | * | 3/1998 | Hsue et al. ...................... 257/755 |
| 5,844,317 | * | 12/1998 | Bertolet et al. ................. 257/773 |
| 5,844,319 | * | 12/1998 | Gemota et al. .................. 257/778 |
| 5,864,946 | * | 2/1999 | Eldridge et al. ................... 29/843 |
| 5,917,707 | * | 6/1999 | Khandros et al. ............... 257/784 |
| 5,977,641 | * | 11/1999 | Takahashi et al. .............. 257/778 |
| 5,989,993 | * | 11/1999 | Zakel et al. ..................... 438/614 |
| 6,011,305 | * | 1/2000 | Suzuki et al. ................... 257/738 |
| 6,011,313 | * | 1/2000 | Shangguan et al. ............. 257/778 |
| 6,024,274 | * | 2/2000 | Chong et al. .................... 257/737 |
| 6,075,710 | * | 6/2000 | Lay ................................. 257/778 |
| 6,082,610 | * | 7/2000 | Shangguan ...................... 257/778 |

FOREIGN PATENT DOCUMENTS

| | | | |
|---|---|---|---|
| 54-48166 | * | 7/1979 | (JP) . |
| 1-257340 | * | 10/1989 | (JP) . |
| 8-115960 | * | 5/1996 | (JP) . |
| 2000-100869 | * | 4/2000 | (JP) . |
| 2000-216292 | * | 8/2000 | (JP) . |

* cited by examiner

Primary Examiner—Alexander O. Williams
(74) Attorney, Agent, or Firm—Gary C. Honeycutt; Fred Telecky; Arthur L. Navarro

(57) ABSTRACT

A device having a thin metallic coating, such as tin which forms strong bonds to copper is provided on the bond pads of an integrated circuit having copper metallization; surface oxidation of the coating is self limiting and the oxides are readily removed, further the coated bond pad forms intermetallics at low temperatures making it both solderable and compatible with wire bonding. A low cost process for forming tin coated copper bonding pads is provided by electroless plating.

2 Claims, 2 Drawing Sheets

# BONDING PADS FOR INTEGRATED CIRCUITS HAVING COPPER INTERCONNECT METALLIZATION

FIELD OF THE INVENTION

This invention relates generally to the field of semiconductor devices, and more particularly to the interconnection and packaging of a integrated circuit having copper bond pads.

BRIEF DESCRIPTION OF PRIOR ART

As the demand for cheaper, faster and more power efficient integrated circuits increases, so must the packing density. Techniques have continually evolved to meet the demands by minimizing the dimensions of the transistors and of the electrical interconnections which integrate the semiconductor devices together in order to form a complete circuit.

Aluminum alloys have been the most commonly used conductive materials for electrical interconnections. While aluminum has very attractive features for use as electrical interconnection in integrated circuits, such as low electrical resistivity and strong adhesion to silicon dioxide, as the conductor line dimensions have become longer and more narrow, deficiencies in aluminum have become limiting factors. The resistance of aluminum begins to contribute significantly to the resistance-capacitance (RC) time delay of the circuit. Additionally, with decreasing dimensions, reliability concerns such as electromigration and current density limitations have increased. For these reasons, the industry has recently begun to shift toward the use of more robust conductive interconnection metals, such as copper. Copper is approximately 40% lower in resistivity and is much more resistant to electromigration. However, with a major change in the interconnect metallization on integrated circuits, there comes a host of new manufacturing and yield issues. Among those issues is the exposed copper bond pads and the difficulty in making interconnections using existing packaging and assembly infrastructure. Copper is readily oxidized, but the oxide formation is not self limiting, as is the case with aluminum. The copper interconnection within the circuit is processed largely under vacuum and the finished product is protected by a passivating layer of silicon oxide or nitride. On the other hand, the bond pads which provide an interface for interconnecting the chip to the next level of interconnection are necessarily exposed metal and the oxidation of copper creates issues for oxide removal and for wire bonding at elevated temperatures. Further, the copper hardness changes with heat exposure which can result in a need for higher bonding forces, and this in turn can cause damage to the underlying dielectric on the integrated circuit, and to uncertainties in the wire bonding process.

One approach to circumventing the copper bond pad issues is to deposit a layer of aluminum over the bonding pads. This is accomplished by vapor deposition of an aluminum layer onto the semiconductor wafer after etching of the passivation layer or overcoat (PO) from the bonding pads. Another set of lithography steps is then required to pattern and etch the aluminum, and thereby form bond pads which can be wire bonded. Such additional wafer processing steps add significantly to the cost of the devices. Alternately, ultrasonic wire bonding at near ambient temperature has been used to avoid oxidation of copper, but it too has significant drawbacks. Not only is the productivity poor, but also it requires a large bonding tool for scrubbing and creating the bond. This in turn requires large bonding pads and is contrary to the overall direction for smaller circuits.

SUMMARY OF THE INVENTION

This invention comprises an integrated circuit device having a plurality of bonding pads on the surface of the die which are extensions from the copper metallization used to interconnect the transistors of the circuit, wherein the bonding pads include a metal coating which makes them amenable to wire bonding. It further comprises such an integrated circuit device, with bond wires attached to the coated bonding pads.

The primary object of this invention is to provide a bonding surface which is compatible with wire bonding on a semiconductor device having copper bond pads, and which does not suffer from the high cost shortcomings of existing technology.

Another object of the invention is to provide a bond pad surface which is compatible with either gold or copper wire bonding to connect the integrated circuit device to the leads of a package or substrate.

Still another object of the invention is to provide a bond pad surface whose resistivity is insignificant in comparison to that of the copper interconnections on the integrated circuit and/or to that of the wire bonds which connect the circuit to the package leads.

A further object of this invention is to provide a bonding surface which adheres strongly to copper metallization on bond pad and does not delaminate under mechanical or thermal stresses.

Another object of the invention is to provide a bonding pad with self limiting surface oxidation, and that oxidation can be readily removed.

A further object of this invention is to provide a coated bond pad surface with attached bond wires comprising either copper or gold.

Still another object of this invention is to provide a bonding pad surface which forms intermetallics at a relatively low temperature and is capable of being bonded at about 200 deg C. or less.

Still a further object of the invention is to provide a bonding pad surface capable of allowing reliable bonds to be formed at a very low mechanical force.

A further object of the invention is to provide an integrated circuit having copper bond pads which are coated with a material which is solderable, and in turn provides the mechanism for a alternate interconnect techniques, such as wire bonding, flip chip or TAB (Tape Automated) bonding.

It is also an object of the invention to provide a low cost method for forming a wire bond compatible coating on the copper bond pads.

An additional object is to provide a low cost process for removing oxides from the copper surface during in the same operation as that used to coat the bond pad.

Still a further object of the invention is to provide an alternate process for forming said bondable surfaces.

Other objects and advantages of the present invention will become apparent from the following descriptions, taken in connection with the accompanying drawings, wherein by way of illustration and example, an embodiment of the present invention is disclosed.

The present invention, accordingly, provides a device having a thin layer of self passivating metal, on the copper bond pads of an integrated circuit, and a mechanically strong alloy between the copper and the metal. The exposed surface of said metal coated bond pads self-limits the amount of oxidation which can form under ambient or processing conditions, and the underlying material remains malleable enough to allow the native oxide to be removed by the ultrasonic scrub step in wire bonding. The coated bond pad forms intermetallics with copper or gold, and thus is readily compatible with wire bonding to either gold and copper.

According to one aspect of this invention, there is provided a thin layer of tin on copper bond pads to form a bronze alloy between the metals, and subsequently the environment is limited to no more than about 150 deg C. for a maximum of 30 minutes. The exposed tin surface self passivates and limits further oxidation. The resulting bond pad is compatible with either gold or copper wire bonding.

Alternate metals are suitable for coating copper bond pads to provide bondable surfaces, such as zinc, indium and lead.

A low cost, reliable method for coating copper bond pad surfaces is provided by electroless immersion plating of tin onto the exposed copper pads of an integrated circuit wafer.

Alternately, a tin layer is provided by vapor deposition onto the surface of an integrated circuit. The excess tin over the protective overcoat layer is then removed by either a lift off process or by chemical mechanical polishing, leaving only the tin attached to the copper bonding pads.

An advantage of tin coated copper bond pads is that integrated circuit wafers having such metal coated copper bonding pads will be assembled into integrated circuit packages using techniques and equipment common throughout the industry. The devices are singulated, and attached to lead frames or other substrates by adhesives typical in the industry, and which are processed at temperatures of approximately 150 deg C. or less.

Further, wire bonds are attached to the coated bonding pads using processes and equipment which currently exist within the industry. With said copper/tin bonding pads of this invention, the tin surface is soft and is readily mechanically abraded by the ultrasonic scrub of the bonder, thereby removing the native oxide, and allowing formation of a tin alloy with the bonding wire material. Heat generated by the ultrasonic vibration of the bonder allows a metallurgical bond between the pad surface and the wire, be it either gold or copper.

The drawings constitute a part of this specification and include exemplary embodiments of the invention, which may be embodied in various forms. It is to be understood that in some instances aspects of the invention may be shown exaggerated or enlarged to facilitate an understanding of the invention.

DETAILED DESCRIPTION OF THE PREFERRED EMBODIMENT

Detailed descriptions of the preferred embodiment are provided herein. It is to be understood, however, that the invention may be embodied in various forms. Therefore, specific details disclosed herein are not to be interpreted as limiting, but rather as a basis for the claims and as a representative basis for teaching one skilled in the art to employ the present invention in virtually any detailed system, structure or manner.

Figure 1A:
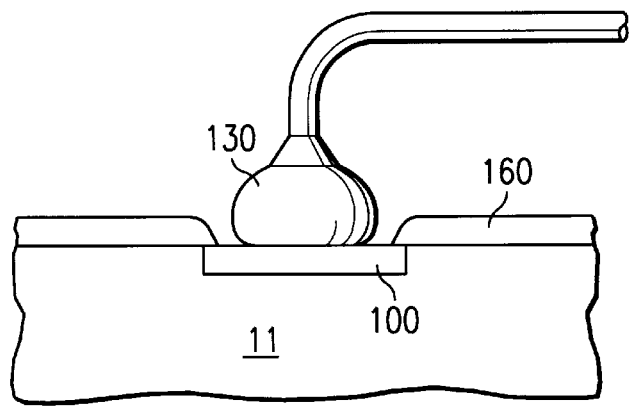
FIG. 1*a* is a cross sectional view of a bonding pad with wire bond attached.
Figure 1B:
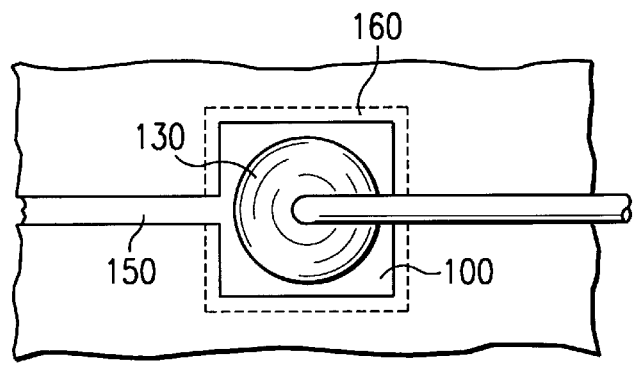
FIG. 1*b* is a top view of a bonding pad attached to the interconnect metallization of an integrated circuit.

Turning now to the drawings, in FIG. 1A there is shown a portion of semiconductor device 11 having a bonding pad 100 with a wire bond 130 attached. In FIG. 1B, bonding pad 100 is an extension of the metal line 150 used for interconnecting transistors on an integrated circuit. Said bonding pad is large enough to support a ball or other type of bond which provides a mechanical, as well as electrical connection to the next level of interconnection; typically pads are 50 to 300 microns on a side, but are kept as small as bonding technology will allow in order to conserve the area of the semiconductor devoted to active devices. The integrated circuit is covered by a protective coating (PO) 160 of silicon oxide and/or nitride to shield the underlying circuitry from mechanical and environmental damage and the PO has openings over the bonding pads to allow contacts for electrical connection between the integrated circuit and a package or substrate. Typically this connection is made by bonding a gold or copper wire to the metal of the bonding pad.

In the present invention, the interconnect metallization is a thin film of copper approximately 0.4 to 2.0 microns in thickness. Copper has begun to replace aluminum as the interconnect metallization in newer circuits due to its lower resistivity. With the increased length and decreased line thickness of very dense circuits, resistivity of aluminum results in high inductance, and this in turn generates increased heating and probability of voiding and other defects in the conductor lines.

However, with copper metallized integrated circuits the unprotected bond pads are subject to the formation of various oxides of copper. Further, copper metallization is subject to changes in hardness as a result of plastic deformation or work hardening.

It is very important in the high speed wire bonding operation that the bond pad surface be both predictable and repetitive. Due to the reactive nature of copper, oxides grow rapidly and variations can occur within the same device and between devices which could cause a serious cost impact during the final stages of fabricating a semiconductor device. Further, wire bonding typically employs heat and mechanical energy to form an intermetallic bond between the wire and the bond pad metallization. Thus the resulting heat contributes to oxide formation and to changes in malleability of copper.

Figure 2:
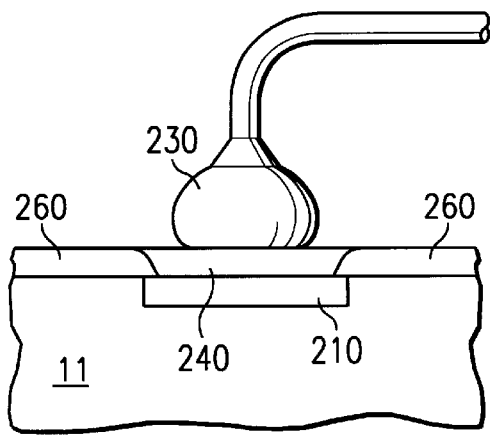
FIG. 2 shows the cross section of a bonded pad having copper metallization capped with aluminum, as in existing art.

FIG. 2 provides a schematic of existing art wherein a copper bond pad 210 is covered by an aluminum film 240, and is bonded with a gold wire 230. In this technology, after the protective overcoat 260 has been patterned to expose the bonding pads, aluminum is vapor deposited on the wafer. Aluminum adheres well to the protective overcoat as well as to the bonding pad and must be removed by etching the pattern formed by photopatterning through apertures in a mask. After the protective overcoat has been patterned and etched, the photoresist is removed. Each of these steps adds significantly to the cost of the integrated circuit.

This process has been used because aluminum provides a known bondable surface. Due to its history as the interconnect metallization for integrated circuits, due to the fact that aluminum forms only a thin layer of self limiting oxide, and due to the malleability of aluminum, the surface can be easily abraded with ultrasonic energy to allow formation of a metallurgical bond between the exposed aluminum bond pad and gold wires 230. Further, the wire bonding process and the equipment for high speed, reliable assembly of integrated circuits is well established, and therefore an aluminum bonding surface over copper presents no technology or infrastructure changes.

In order to provide a cost effective solution to the copper bond pad surface problems, a bondable surface must be provided without additional steps which involve costly patterning and removal steps.

Figure 3:
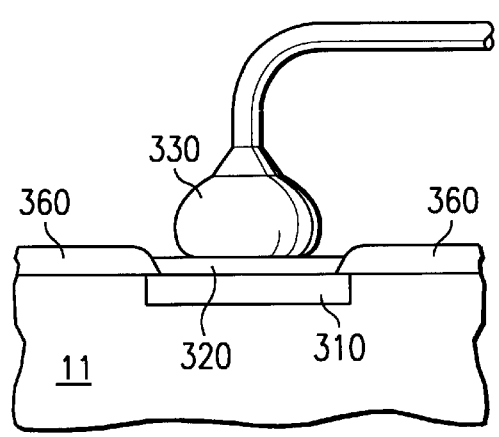
FIG. 3 shows the cross sectional view of a tin coated copper bond pad of the current invention.

According to a preferred embodiment of the present invention as shown in FIG. 3, a layer of tin 320 caps the copper layer 310 of the bonding pad and the tin in turn is metallurgically joined by the bond wire 330. The protective overcoat 360 defines the bond pad edge.

Figure 4A:
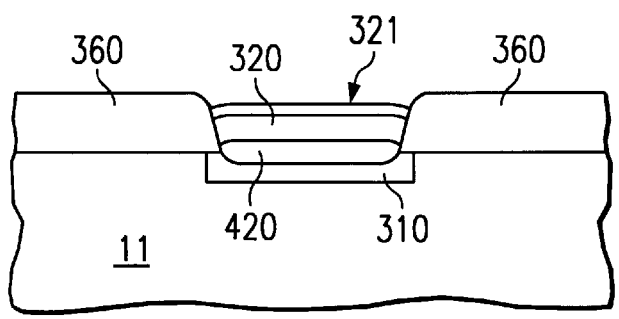
FIG. 4*a* depicts in greater detail the composition of a bond pad of the current invention.
Figure 4B:
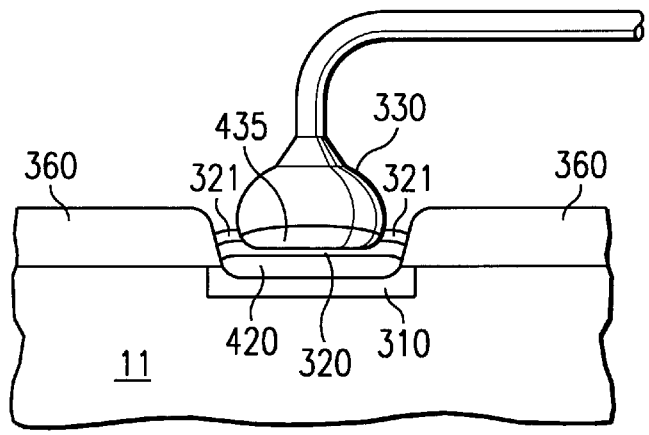
FIG. 4*b* depicts the composition of a bond pad of the current invention.

To explain further, the tin coated copper bond pad of the present invention, FIGS. 4A and 4B show in greater detail the composition of said bond pad before and after wire bonding. In a preferred embodiment of this invention, tin is selected as the metal coating for copper bonding pads because a strong tin-copper bronze alloy 420 is readily formed at the interface of the copper bond pad 310 and the tin layer 320. Tin has a practical nobility greater than copper, according to the Marcel Pourbaix Atlas of Electrochemical Equilibria and the surface is self passivating; i.e. forms a thin oxide layer 321 which limits further oxidation of the surface.

With exposure to heat limited to a maximum of 150 deg C. for no more than 30 minutes, the bronze alloy 420 does not proceed completely through the tin layer 320, but instead the surface remains a layer of tin 320 with its very thin layer of passivating tin oxide 321. Owing to the malleability of tin, it is readily abraded by ultrasonic vibration of the wire bonder and allows the oxide 321 to be wiped aside, thus exposing a clean tin surface 320.

In FIG. 4B, the exposed tin surface 320 readily reacts with wire 330 to form a strong metallurgical alloy bond at the interface 435. With the heat generated by the bonding process, alloying of the tin and copper layers will be completed.

Another important factor, in the selection of tin as the coating metal for copper bond pads, relies on the fact that tin forms alloys with copper at temperatures of about 200 deg C., and low temperature wire bonding can be achieved at a relatively low temperature for copper wire bonding. Because of the lower cost of copper as compared to gold wire, there has been an effort to bond with copper rather than gold. Copper wire bonding has been hampered from major production because it was necessary to heat the wire during bonding to aluminum bond pads, and this resulted in oxidation of the bond wire itself. In the preferred embodiment, copper wire is employed because of the ability to use only ultrasonic energy to form a bond a low temperature with tin and thus avoiding oxidation of the copper wire by heat during the bonding process.

Figure 5A:
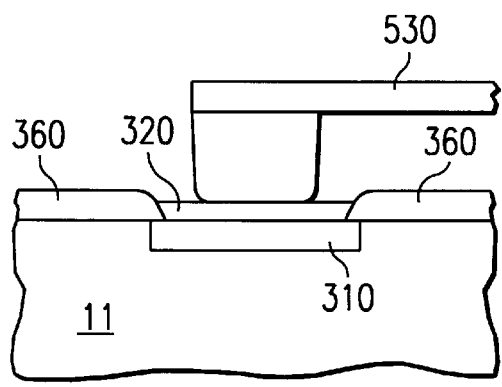
FIG. 5*a* illustrates a TAB bonded structure of the current invention.
Figure 5B:
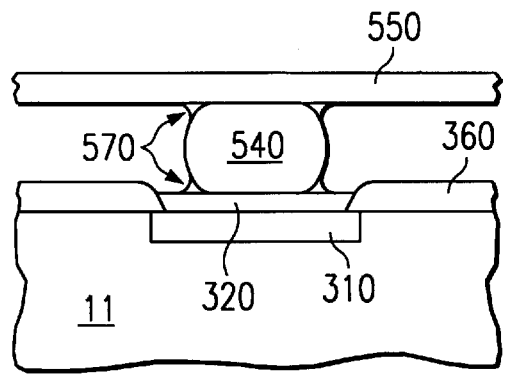
FIG. 5*b* illustrates a soldered ball connection of the current invention.

In addition, tin has been widely used in the electrical and electronics industries for coating copper wires and other conductors because it provides a solderable surface which protects against oxidation and corrosion, but yet is mechanically strong under thermal and mechanical stresses. Solderable is used to imply the ability to achieve a clean metallic surface so that good wetting of a molten solder can be formed. According to this invention, a tin coated copper bond pad is readily solderable and can form a bond not only by reacting with wires of copper or gold, but also with TAB film connectors, or with a number of solders to form a flip chip interconnection. FIG. 5A gives an example of a TAB film 530 bonded to the tin 320 coated copper 310 bond pads of this invention. FIG. 5B shows a metal sphere 540 solder reflowed 570 to connect a flip chip substrate 550 to the tin coated 320 copper bond pad 310 of this invention.

While tin comprises the preferred embodiment of this invention, it is not intended to be limited to this coating. Alternate metals, such as zinc, lead and indium are suitable for coating copper bond pads to provide bondable surfaces.

In accordance with an important feature of the present invention, resistivity of the coated bonding pad and bond interface must be kept insignificant with respect to the total interconnect structure. The resistivity of bronze is about 100 micro ohms-cm, as compared to approximately 1.2 micro ohms-cm for copper. However, given the thickness of the integrated circuit leads to be at most 2 microns, the lead sheet resistivity is about 8.5 milliohms/square. In accordance with a preferred embodiment of the current invention, the copper/tin bond pad 100 thickness is 1–3 microns. In addition, the bronze alloy layer 435 formed by a copper wire bond 130 is about 2 microns, under a 50 micron ball diameter, making the total resistivity of the pad with joint to be about 2 to 4 milliohms. This is an acceptably insignificant value.

Turning now to a low cost method for forming wire bondable bond pads on an integrated circuit device having copper metallization. Immersion electroless plating provides a most cost effective and reliable approach for depositing an adherent layer of tin on exposed copper pads. Electroless plating involves the use of a plating bath without introduction of electrical current. In a preferred embodiment of this invention, a semiconductor wafer of integrated circuits having copper interconnect metallization which extend to form an array of exposed metal bonding pads, but having a protective overcoat over the active circuitry, is immersed in a plating solution of a salt of the plating metal, for example tin chloride. Processing is carried out at ambient, but controlled temperature. Reducing agents in the plating solution initiate the reaction and give good adherence to copper. Further, the reducing agents, such as caustic and sodium cyanide serve to clean the copper bonding pads of oxides which have formed prior to the plating process, and thus serves to both clean and support plating of the bonding pads during the same process.

In the preferred embodiment the tin thickness is 1–2 microns and because the plated-on surface is autocatalytic, thickness build up will be controlled. The wafer with plated bond pads is rinsed with clean water and dried at temperatures not to exceed 120 deg C.

The semiconductor wafer is then processed through packaging assembly using standard techniques for dicing, and attaching to a substrate or lead frame. An adhesive which is cured at 150 deg C., maximum is used in order to avoid further alloying of the copper/tin bond pad layers.

Wire bonding is accomplished using wire bond equipment well known and established in the industry. In the preferred embodiment, copper wire provides the electrical connection between the integrated circuit and the lead frame or substrate, and thus allows a lower cost solution than the more conventional gold wire. Bonding is accomplished by an ultrasonic scrub to remove the surface oxide and bond temperatures of less than 200 deg C. are maintained to avoid oxidation of the copper wire. Bonding typically is completed within a few seconds to a maximum of three minutes.

Owing to the low melt temperature, 232 deg C., of tin and its reactivity with copper, tin on the bond pad surface melts and forms an alloy connection with the wire, or with an alternate interconnection medium at about 200 deg C. or less. Bonding is preceded by an ultrasonic scrub or mild flux treatment to remove the tin oxide. Processing time where the temperature is at the maximum are of short duration, about 30 to 180 seconds.

Further because alloying of tin to copper reacts readily, the bonding reaction proceeds with only a very low energy, and thus minimizes any damage to the integrated circuit device.

An alternate process to electroless plating of tin or other metal on copper bonding pads provides that a thin layer of tin is vapor deposited onto the semiconductor wafer. Deposition is carried out following etching of the openings in the protective oxide, but before the photoresist used to pattern the openings is removed. A lift off process then removes both the photoresist and the excess tin on the resist, but leaves the layer of tin covering the bonding pads. Subsequent assembly processing is unchanged from that described above.

Yet another alternate method for forming bondable pads follows the above process for tin deposition, but makes use of chemical mechanical polishing to remove the excess tin.

Tin is the preferred metal bond pad coating of this invention, but coating processes for indium, zinc or lead are similar, and will be familiar to those skilled in the art.

In summary, copper bonding pads can be coated with a layer of tin to yield a bond surface which is self passivating, has low resistivity and is compatible with either copper and gold wire bonding, as well as provides a solderable surface for alternate interconnect technologies. Further, said bond pad surface reacts at low temperature and is amenable to low temperature bonding preferred for low cost copper wire bonding. In addition, the coated bond pad is compatible with the use of existing bonding technology and infrastructure. Elecroless tin plating provides a reliable and low cost method for coating copper bonding pads without additional photolithography steps, and it yields surfaces which are compatible with bonding.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the appended claims.

What is claimed is:

1. An integrated circuit having copper interconnect metallization which includes an array of bonding pads, said bonding pads consisting essentially of copper and a coating of tin on the copper; and a bond wire attached to at least one of said bonding pads.

2. A circuit as in claim 1 wherein the tin coating is 1 to 2 microns thick.

\* \* \* \* \*